United States Patent [19]

Vitiello

[11] Patent Number: 4,814,725
[45] Date of Patent: Mar. 21, 1989

[54] PHASE LOCK CIRCUIT FOR COMPENSATION FOR BIT FREQUENCY VARIATIONS

[75] Inventor: Paolo Vitiello, Rho, Italy

[73] Assignee: Honeywell Bull, Inc., Minneapolis, Minn.

[21] Appl. No.: 110,897

[22] Filed: Oct. 21, 1987

[30] Foreign Application Priority Data

Nov. 12, 1986 [IT] Italy ................................ 22305 A/86

[51] Int. Cl.$^4$ ............................................. H03L 7/00
[52] U.S. Cl. ....................................... 331/1 A; 331/25
[58] Field of Search ..................... 331/1 A, 16, 17, 20, 331/25

[56] References Cited

U.S. PATENT DOCUMENTS 4,546,330 10/1985 Okada ............................. 331/1 A X
4,633,488 12/1986 Shaw ............................... 331/1 A X Primary Examiner—Eugene R. LaRoche
Assistant Examiner—Robert J. Pascal
Attorney, Agent, or Firm—George Grayson; John S. Solakian

[57] ABSTRACT

A phase lock circuit for compensation for bit frequency variations of information read from a movable magnetic media including a phase comparator, a number of low pass filters, a decoupling element and variable frequency oscillator which is temperature compensated.

6 Claims, 4 Drawing Sheets

PHASE LOCK CIRCUIT FOR COMPENSATION FOR BIT FREQUENCY VARIATIONS

BACKGROUND OF THE INVENTION

1. Scope of the Invention

The present invention relates to a phase lock circuit for the recognition of digital information read out from a movable magnetic media, typically for disk units.

2. Description of the Prior Art

The magnetic recording technique commonly used in such units is the modified frequency modulation (MFM).

The binary information is recorded along each track of the magnetic media in sequence as magnetic transitions located in cells, which, in relationship to the speed of the media and a read/write head, are defined by a time interval or nominal duration.

For a typical rigid disk unit having a ST506 interface the cell has a standard nominal duration of 200 nanoseconds (ns).

For a 5¼" flexible disk unit the cell has a nominal standard duration of 4 microseconds (usec).

Recently 5¼" flexible disk units have been put on the market with nominal cell duration of 2 usec.

In addition units for flexible disks having 8" diameters continue to be used in the market with a nominal cell duration of 2 usec (recorded in MFM or double density) and with a nominal cell duration of 4 usec (recorded in FM or single density).

In the MFM magnetic recording, information bits having a logic level 1 are recorded as a magnetic transition at the center of the cells and bits having a logic level 0 are recorded as having no transition in the cells.

In order to provide a timing signal even in presence of a "zeroes" sequence, subsequent "zero" cells are identified by a magnetic transition recorded at the boundary between the cells.

This transition is missing if a cell containing a bit "0" is preceded or followed by a cell containing a bit "1".

The FM coding method, contemplates the recording of a magnetic transition at each cell boundary and the presence of a transition in the middle of a cell in case of a "1" or no transition in the middle of a cell in case of a "0".

When the magnetic media is read, each transition generates an electrical read pulse.

Therefore, in case of cells having a nominal duration of 200 ns the read pulses nominally occur 200, 300, or 400 nsec apart. In the case of cells having nominal duration of 2 usec, the read pulses nominally occur 2, 3, or 4 usec apart. In the case of cells having a nominal period 4 usec, the read pulses nominally occur 4, 6 or 8 usec apart. In the case of cells having a nominal period 4 usec (but with FM or single density coding) the read pulses nominally occur 2 or 4 usec apart.

Owing to changes in the rotational speed of the media and to the so called "peak shift" phenomena of the recorded magnetic pulses, the effective durations of the read out intervals differ from the nominal durations and give rise to a signal having a variable phase and frequency which makes the discrimination among bits 0, 1 and timing pulses particularly difficult.

Phase lock circuits are used to perform such discrimination. These are circuits which, in response to the sequence of electrical pulses produced by reading the disk, generate a timing signal having a frequency which varies from the basic frequency of the read out pulse sequence, but which ignore the significant modulation due to the magnetic recording process.

Such circuits must lock in a fast way to the read out data frequency, must be able to quickly follow the magnetic media speed changes, and must ignore the phase changes due to the significant modulation.

In addition, such circuits should operate at different working frequencies, in order to work with media recorded at different frequencies and in different coding modes.

Phase comparators, in form of integrated circuits have been recently put on the market.

By adding some external components to the phase comparators, it is possible to obtain discriminating phase lock circuits. However such circuits have limitations which prevents the design of reliable discriminators for a wide range of the magnetic media speed variation, which have fast locking and are stable in operation.

The phase lock circuit which is the object of the present invention overcomes such limitations and is further capable of handling magnetic media recorded in single or double density at different frequencies, typically the standard frequencies of 5 MHz, 500 KHz and 250 KHz.

SUMMARY OF THE INVENTION

A phase lock circuit for generating a periodic reference signal has a variable frequency, locked to the frequency of a sequence of electrical pulses corresponding to information read out from a movable magnetic media. The information is recorded in phase modulation as to a nominal frequency, comprising a phase comparator for generating a pulsed signal (P UP) having width proportional to the lead error of the electrical pulses as to the periodical reference signal, logical circuits for generating a pulse signal (P Down) having width proportional to the lag error signal, a plurality of low pass filters having two poles and one zero and selectable in a mutually exclusive way for generating a continuous signal having a variable voltage as a function of said pulsed error signals, a decoupling element having the function of voltage follower for inputting the continuous signal to a variable frequency oscillator, temperature compensated, which generates the periodical reference signal, the selection of each one of the low pass filters determining an optimized frequency response of the phase lock circuit for each of different working conditions defined by different nominal frequencies of information recording.

BRIEF DESCRIPTION OF THE DRAWINGS

The features and the advantages of the invention will appear more clearly from the following description of a preferred for of embodiment and from the enclosed drawing

DESCRIPTION OF PREFERRED EMBODIMENTS

Figure 1:
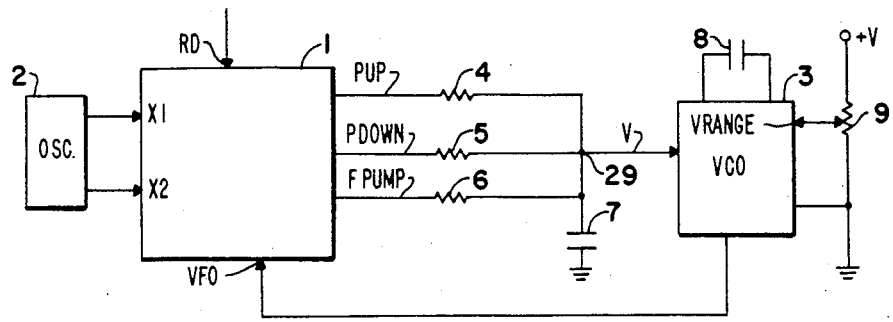
FIG. 1 shows a phase lock circuit of the prior art.
Figure 2:
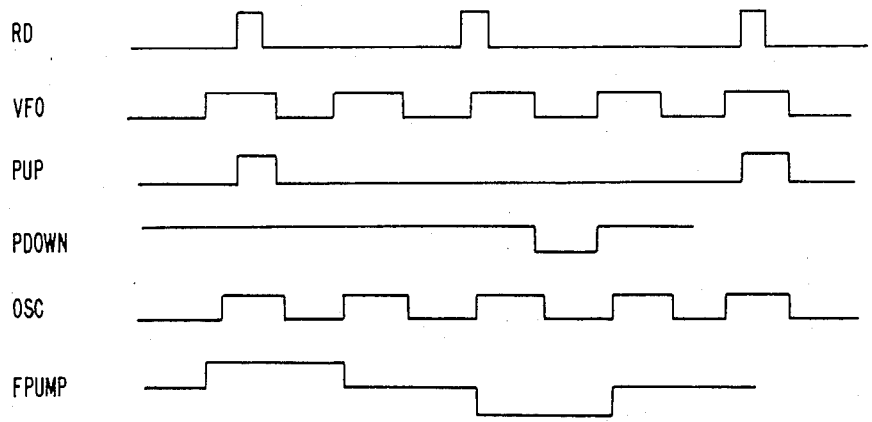
FIG. 2 shows a timing diagram of the signal level at some points of the circuit of FIG. 1.

FIG. 1 shows a phase lock circuit known in the art, whose operation is easily understood with reference to the timing diagram of FIG. 2. The phase lock circuit makes use, as a basic component, of an SCB68459 phase comparator integrated circuit 1, which is produced by Signetics Corp.

The phase comparator 1 has two inputs, X1 and X2, connected to the outputs of an oscillator 2.

The oscillator 2 provides a square wave timing signal OSC (FIG. 2) having a frequency twice the basic frequency of the read out information stream.

This frequency is 1 MHz in the case of diskettes recorded in MFM at 500 KHz.

Phase comparator 1 receives the read signal pulses RD, FIG. 2, produced by a read head.

Such pulses are approximately 3 or 4 usec apart. Phase comparator 1 further receives a square wave periodic signal VF0, FIG. 2, produced by a voltage controlled oscillator 3 which typically is a SN74LS629 integrated circuit manufactured by Texas Instruments.

Signal VF0 has a variable frequency which straddles the frequency of signal OSC of oscillator 2. Phase comparator 1 provides three output signals P UP, P DOWN, F PUMP having the following features. If signal RD goes high when signal VF0 is high, then the P UP output signal which is normally at a high impedance, is connected to a positive voltage source (+5 V) until the fall of signal VF0, thus providing a positive voltage pulse. If signal RD goes high when signal VF0 is low, then output signal P DOWN, normally at a high impedance, is connected to ground during the next half cycle for which signal VF0 is low.

Output signal F PUMP is a cyclic signal which is at +5 volts for a whole period of signal VF0, at a high impedance for at least the next half period of signal VF0, and at ground for the entire duration of the signal OSC cycle. Signal F PUMP is again at a high impedance until the start of the next signal VF0 cycle after which it goes to +5 volts. Thus it may be noted that, if the rise of the RD pulses are in synchronism with the falling edge of VF0, the two outputs P UP, P DOWN are kept in the high impedance state and no output signals are produced. If the rising edge of RD is in advance of the falling edge of VF0, the output P UP goes to +5 V for a time interval proportional to the phase lead.

Signal P UP is therefore a phase error signal whose duration is proportional to the lead error. Likewise, if the rising edge of RD is lagging as to the falling edge of VF0, the output P DOWN goes low for a time interval which is nearly constant and equal to half the VF0 period.

Signal P DOWN is therefore a lag error signal which is not error proportional. Likewise the F PUMP signal is proportional, an average, to the error difference between the frequency of the two signals VF0 and OSC.

Signals P UP, P DOWN, F PUMP are applied to an integrating network comprising three resistors 4, 5 and 6, and a capacitor 7.

The three resistors are connected to output signals P UP, P DOWN, F PUMP respectively, and to a common node 29. Also connected between common node 29 and ground is the capacitor 7.

As can be seen from FIG. 2, signal P UP tends to charge while signal P DOWN tends to discharge capacitor 7.

Signal F PUMP tends on the average to charge capacitor 7 if the period of signal VF0 is greater than that of signal OSC and to discharge capacitor 7 in the opposite case.

The variable charge voltage V across capacitor 7 is applied to a control input of oscillator 3, which modifies its oscillating frequency, which is set by a capacitor 8 and a voltage divider 9. The voltage divider 9, which is connected between V+ volts and ground is set to generate a VRANGE voltage.

The described regulation circuit operate by changing the frequency of signal VF0 in such a way that the rising edge of read signal RD is as close as possible to and in the best case coincident with the falling edge of signal VF0.

Signal VF0 may therefore be used by a control unit, not shown, to generate pulses derived from the read pulses RD, but synchronized with signal VF0, which may be discriminated as data pulses or timing pulses.

The described circuit has the following limitations. The manufacturer of phase comparator 1 recommends for resistors 4, 5 and 6, the value of 1K, 10K and 100K respectively, and for capacitor 7 a value C such that the time constant T of the low-pass filter comprised of resistor 4 and capacitor 7 be 5 times the nominal occurrence period of the read signal RD.

Figure 3:
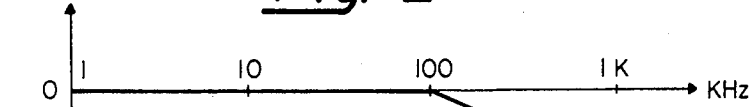
FIG. 3 shows a Bode diagram of the frequency response of the low-pass filter used in the circuit of FIG. 1.

For data recorded at 500 KHz (2 $\mu$sec period) the time constant of the circuit is therefore 10 $\mu$sec and gives rise to a frequency response diagram of the type shown in FIG. 3.

The diagram shows that the low-pass filter has a constant gain until the cut off frequency of 100 KHz and a 20 dB per decade attenuation thereafter.

The low-pass filter is only one of the blocks which comprise the feedback control system.

The other blocks are the phase comparator 1 and the VC0 3.

The phase comparator 1 is characterized by a constant gain Kd for the whole frequency range of interest while the VC0 3 is intrinsically equivalent to a pure integrator with a transfer function which in syntetic form is expressed by the relationship $$K(S)VCO = \frac{Ko}{S}$$

where S is the Laplace variable and Ko the block gain at zero frequency.

The open loop transfer function of the whole system is therefore:

$$K(s) = \frac{Kd \cdot F(s) \cdot Ko}{S}$$

where F(s) is the transfer function of the low pass filter.

Figure 4:
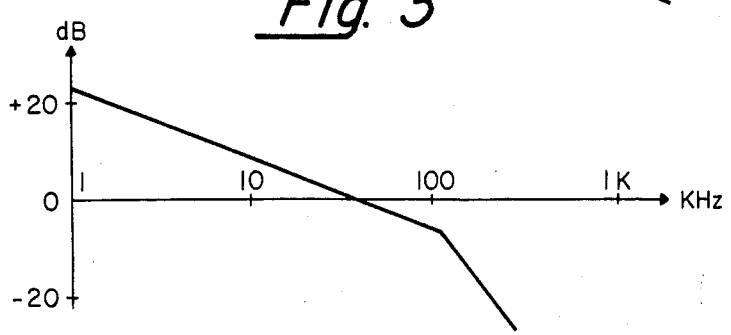
FIG. 4 shows a Bode diagram of the open loop frequency response of the circuit of FIG. 1.

Since the VC0 gain has a pole at zero frequency and the low pass filter has a pole at frequency 1/T, where T is the time constant of the filter, the transfer function has two poles. This results in, when displayed on the Bode diagram of FIG. 4, a 20 dB per decade slope in the frequency range from zero to 100 KHz and a 40 dB per decade slope from 100 KHz thereafter. This feature may appear advantageous because it reduces the sensitivity of the system to sudden phase changes having a frequency greater than 100 KHz, but the trade off is a limitation of the gain which may be established for the control loop.

In fact, for the system stability, it is required as a canon, that the attenuation curve crosses the line corresponding to a 0 dB gain with a slope of 20 dB per decade. This results in the adoption of a limited gain in the range from 1 to 2 KHz, which gain is inadequate to provide a fast phase lock and a prompt response to speed changes of the magnetic media (which changes mostly occur in the range from 1 to 2 KHz), while in the range from 10 to 100 KHz the gain is greater than 1 with possible excitation of oscillations, however damped. Further the current drained at the VC0 3 input causes, even in static conditions, a regulation offset that is a constant delay of signal VF0 as to signal RD. Similar considerations are true for the control loop which makes use of signal P DOWN as a control signal.

In this case the circumstance that the correction signal is not proportional to the error results in a gain inversely varying with the error amount and renders the system behavior even more uncertain.

Figure 5:
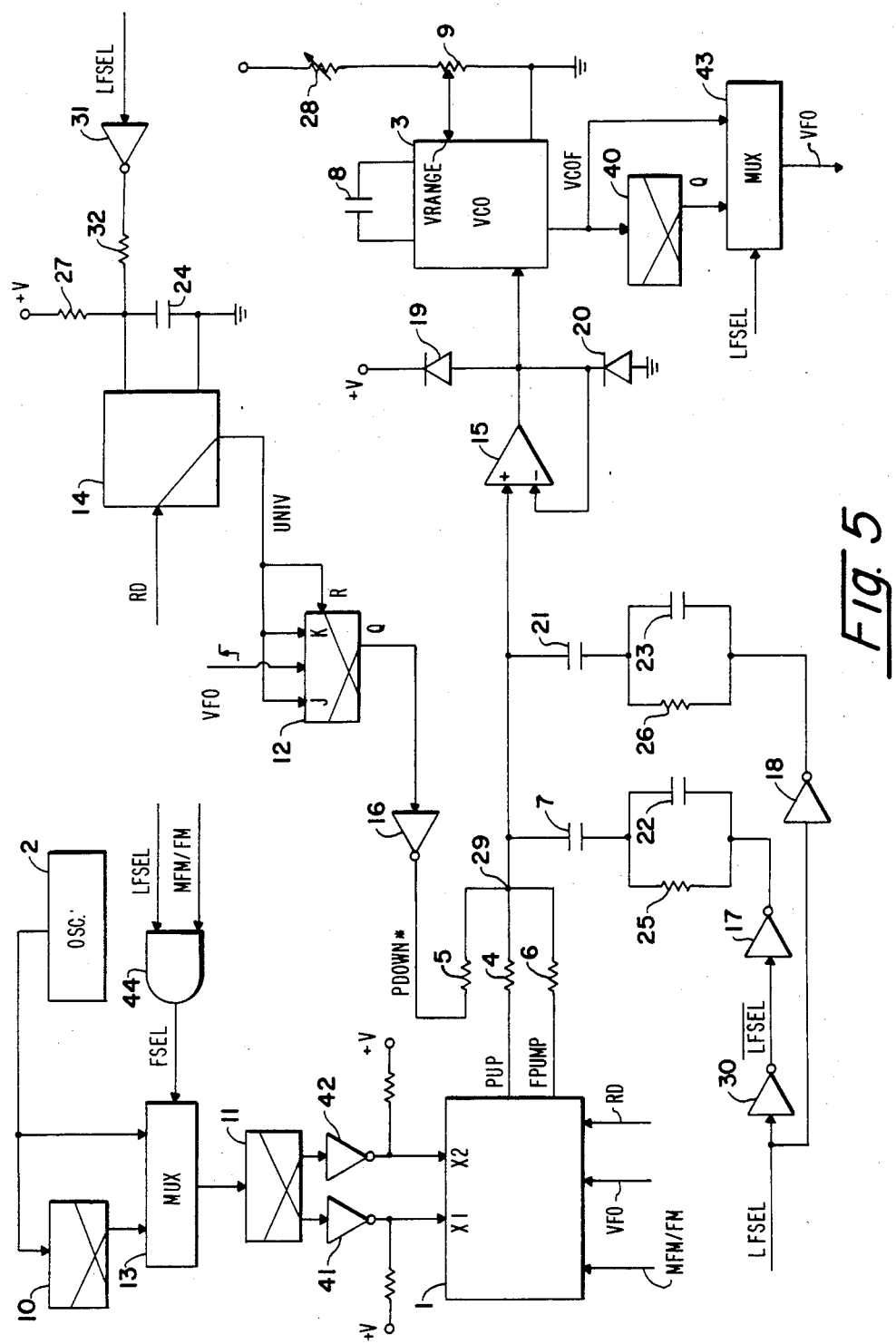
FIG. 5 shows a first preferred form of embodiment of phase lock circuit according to the invention.

FIG. 5 shows a preferred form of embodiment for a phase lock circuit in accordance with the invention. In FIG. 5 several of the components are the same as in FIG. 1 and are referenced with the same number.

In addition, the phase lock circuit of FIG. 5 comprises four JK flip-flops 10, 11, 12 and 40, two inputs multiplexers 13 and 43, a monstable multivibrator 14, an operational MOSFET amplifier 15, 6 open collector inverters 18, 31, 41 and 42, two diodes 19 and 20, four capacitors 21, 22, 23 and 24, four resistors 25, 26, 27, and 32, a positive temperature coefficient PCT resistor 28, an inverter 30 and a two input AND gate 44.

The oscillator 2 provides in this case a square wave signal having a 2 MHz frequency. The oscillator 2 output is connected to the clock input of flip-flop 10 arranged to operate as a frequency divider.

Therefore a square wave signal having 1 MHz frequency is available at its direct output.

The flip-flop 10 output is connected to an input of a multiplexer 13. A second input of multiplexer 13 is directly connected to the oscillator 2 output. A signal FSEL applied to the control input of multiplexer 13 selects which of the input signals is transferred to the multiplexer output.

When FSEL=1, the multiplexer 13 transfers the signal having frequency of 1 MHz, and when FSEL=0 the signal having frequency of 2 MHz is transferred.

The output signal from multiplexer 13 is applied to the clock input of flip-flop 11, providing a further frequency division. The outputs of flip-flop 11 are connected, through the open collector inverters 41 and 42 to the inputs X1 and X2 respectively of the phase comparator 1.

The outputs of the two inverters 41 and 42 are connected through their pull up resistors to a voltage source +V.

Therefore, depending on the level of signal FSEL, a signal having a frequency of 500 KHz or 1 MHz is selectively received at inputs X1 and X2. The arrangement is provided so that the circuit of FIG. 5 may operate both with magnetic media recorded at 250 KHz and in the MFM mode at 500 KHz depending on external control signal FSEL. The phase comparator 1 further receives a signal MFM/FM which controls the circuit to operate, in addition to the MFM mode, with magnetic media recorded in FM mode (signal MFM/FM=0) at a frequency equal to ¼ of the received clock signal frequency.

Therefore in order to allow the operation in FM mode, the signal FSEL is the logical AND provided by AND gate 44, of the two signals MFM/FM and LFSEL the latter being indicative, when at logical level 1 of a working frequency of 250 KHz. Additionally there is the need to adapt the frequency response or regulation diagram of the system to two different working conditions.

To this purpose, capacitor 7, instead of having one terminal permanently grounded, has the terminal connected to the open collector output of an inverter 17 through resistor 25 and a parallel connected capacitor 22.

A second capacitor 21 is connected to node 29 on one side, and to the output of an inverter 18 through a resistor 26 and a parallel connected capacitor 23. The function of resistors 25, 16 and capacitors 22, 23 is as follows.

Inverter 17 has the input connected to the output of an inverter 30.

Both inverters 30 and 18 receive as an input, the signal LFSEL.

Figure 6:
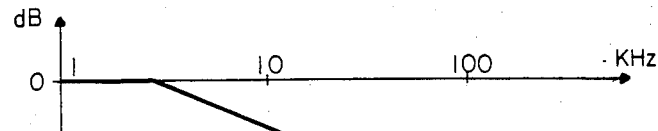
FIG. 6 shows a Bode diagram of the frequency response of the low-pass filter used in the circuit of FIG. 5.

When LFSEL=1, capacitor 7 is isolated from ground and capacitor 21 is virtually ground connected (through resistor 26) and when LFSEL=0, capacitor 21 is isolated from ground and capacitor 7 (through resistor 25) is virtually ground connected. By selecting the values of the two capacitors 7 and 21, two different time constants may be defined for the integrating network, respectively for operation at a nominal frequency of 500 KHz (LFSEL=0, capacitor 7 ground connected) and at a nominal frequency of 250 KHz (LFSEL=1, capacitor 21 ground connected). The addition of a resistor 25 or 26 and a parallel connected capacitor 22 or 23 between the terminals of capacitors 7 and 21 respectively and ground, provides an integrating network or low pass filter having two poles and a zero, with an attenuation diagram of the type shown in FIG. 6. FIG. 6 shows two steps, whose position on the abscissa (the frequency axis) is determined by the value of the components.

Figure 7:
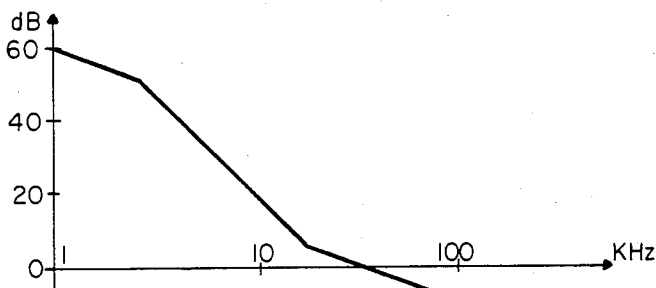
FIG. 7 shows a Bode diagram of the open loop frequency response of the circuit of FIG. 5.

It indicates that the open loop transfer function of the whole control system is represented by a Bode diagram of the type shown in FIG. 7. A frequency response diagram is obtained, which is characterized by a high gain at low frequencies, and the crossing of the 0 dB gain line occurs with a slope of 20 dB per decade at a frequency which may be suitably set at approximately 30 or 60 KHz for operation of the circuit at 250 and 500 KHz. A further element which distinguishes the circuit of FIG. 5 from the circuits known in the art is that resistor 5 is not connected to the output signal P DOWN of phase comparator 1.

Instead, resistor 5 is connected to the open collector output of an inverter 16, whose input is connected to the Q output of a JK flip-flop 12. Flip-flop 12 is triggered by signal VF0 received at the clock input. The J, K inputs and the reset input R of flip-flop 12 are connected to the output of a monostable multivibrator 14, which is typically a 74LS123 circuit.

Multivibrator 14 is triggered by the rising edge of signal RD to generate a pulse at logical level 1.

The pulse duration is established by the time constant of an external RC circuit, consisting of a resistor 27, a capacitor 24 and a resistor 32. A terminal of resistor 27 is connected to the power voltage source +V. The other terminal, together with a first terminal of resistor 32 is connected to an input of multivibrator 14 and to a terminal of capacitor 24. The other terminal is ground connected.

Figure 8:
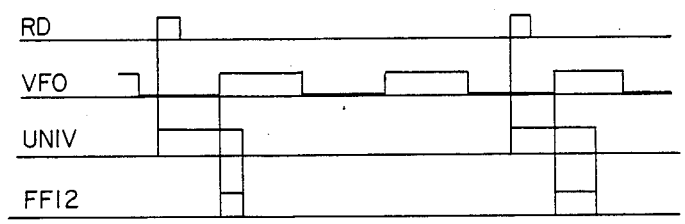
FIG. 8 shows a timing diagram of the signals present at some points of the circuit of FIG. 5.

The second terminal of resistor 32 is connected to the open collector output of an inverter 31, which receives the input signal LFSEL. The values of resistors 27 and 32 and capacitor 24 are so selected that the duration of the pulse generated by multivibrator 14 is equal to half the period of the frequency received by phase comparator 1 at inputs X1, X2, that is 0.5 microseconds when LFSEL=0 and 1 microsecond when LFSEL=1. The operation of the control system made up of the multivibrator 14, flip-flop 12, inverter 16 and resistor 5 may be easily understood with reference to the timing diagram of FIG. 8. At each read pulse RD, a pulse UNIV is generated which has a duration very close to half the period of signal VF0.

In fact the frequency of signal VF0, under normal operating conditions, coincides with or slightly departs (±5%) from the nominal working frequency. (The frequency F0 received at inputs X1, X2 of circuit 1). When the read pulses RD are leading the falling edge of signal VF0, the pulse UNIV goes low before the VF0 signal rises from 0 to 1.

Therefore the rising edge of signal VF0 does not have any effect on flip-flop 12 which is held reset by signal UNIV =0 present at the reset input.

Thus the inverter 16 output is ground isolated together with terminal of resistor 5. When the read pulses RD are lagging the falling edge of signal VF0, the UNIV pulse is high when signal VF0 rises from 0 to 1.

Therefore the rising edge of signal VF0 sets flip-flop 12 (Diagram FF12) which remains set until pulse UNIV goes low.

This temporarily grounds resistor 5 and has the effect of applying an error signal at logic level 0 to resistor 5. This error signal has a duration substantially proportional to the lag of the RD pulses and tends to discharge capacitor 7 or 21 with a corresponding and proportional correcting effect.

This signal is referenced in FIG. 5 as P DOWN* to distinguish it from signal P DOWN generated by phase comparator 1.

The control performances of the system are therefore greatly enhanced as to those of the FIG. 1 circuit. A further inventive aspect is that node 29 on the integrating network is not connected to the input of controlled oscillator 3, but to the non-inverting output of a MOSFET operational amplifier 15, typically a National Semiconductor LF 347 circuit.

The input impedance of the amplifier 15 is virtually infinite.

Therefore the "regulation offset" and instability intrinsic in the control circuit of the prior art are avoided.

The output of amplifier 15 is connected to the control input of controlled oscillator VC0 3.

Two diodes 19 and 20, connected between the output of amplifier 15 and the power voltage source +V or ground respectively, guarantee that the output signal from amplifier 15 remains in the range of between 0 and +V volts.

The inverting input of the amplifier 15 is connected to the output so that it works as a voltage follower with unit gain. A further improvement is in the use of a positive temperature coefficient PCT thermistor 28 connected in series between the voltage source +V and voltage divider 9 to ground. This compensates for the thermal drifting.

In other words, the generated frequency, for a given control voltage applied to the VC0 3 and for a given capacity and range voltage VRANGE, which define the operating range, varies with the temperature and tends to decrease as the temperature increases.

The PCT 28 changes the range voltage as an inverse function of the temperature, thus compensating for the effects of temperature drift.

A further inventive aspect is that, even if the described circuit with media recorded at different frequencies (250 KHz and 500 KHz), the controlled oscillator VC0 3 operates in both cases, around the same working point, that is around the 1 MHz frequency.

Output signal VFC0 from oscillator 3 is applied to an input of multiplexer 43 and to the clock input of flip-flop 40, which operates as a frequency divider.

The direct output Q of flip-flop 40 is connected to a second input of multiplexer 43 which is controlled by signal LFSEL. Signal LFSEL=1 indicates that the circuit must operate with data recorded at a frequency of 250 KHZ, therefore multiplexer 43 transfers the output signal provided by flip-flop 40 which has a frequency of about 500 KHz. When LFSEL=0, the multiplexer transfers the output signal generated by oscillator 3 having a frequency of about 1 MHz.

In other words a signal is present at the output of multiplexer 43 which has the frequency required for different working conditions even if voltage controlled oscillator 3 always operates around a single working point. This is very important because the working point is precisely set with a single trimming operation and the use of a single trimming element (voltage divider 9). The phase lock circuit described with reference to FIG. 5 provides far greater performances than those provided by phase lock circuits known in the art and is particularly suitable when speed variation of the magnetic media are contained in a reasonable range (±5%) as to the nominal speed. It is, however, possible to extend its performances for use in magnetic recording units where the speed of the magnetic media is possibly affected by broader changes.

In fact, it has been said that the duration of signal P DOWN is substantially proportional to the phase lag between the read pulses RD and signal VF0.

This is strictly true when the frequency of signal VF0 is equal to the nominal working frequency F0 of the system (that is the oscillator 2 frequency divided by 2 or 4 depending on the recording density).

In practice the frequency of signal FV0 departs from the nominal frequency by following the changes in the magnetic media speed. Since the period of the pulses generated by multivibrator 14 has a fixed duration equal to ½ F0, the proportional relationship is not rigorously followed when the frequency of signal VF0 differs from F0. When the frequency of VF0 is greater than the frequency of F0, there is an overlapping in time, between pulses UNIV produced by multivibrator 14 and the positive half waves of signal VF0 even if the read pulses RD are phase leading as to signal VF0.

In this case there is a phase lead range in which signals P UP and P DOWN are jointly produced with opposite effect and partially neutralize each other. When the frequency of VF0 is less than the frequency of F0, there is a phase lag range for signal RD in which no P DOWN* signal is generated.

Figure 9:
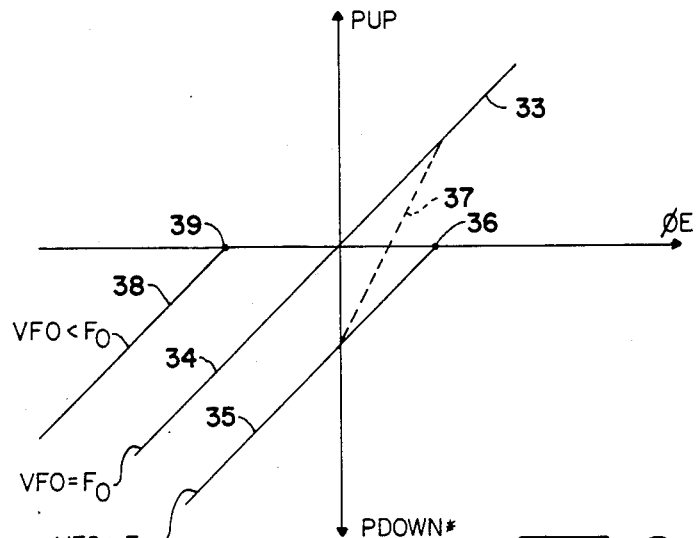
FIG. 9 shows a graph of the response of the FIG. 5 circuit at operating conditions around the nominal working frequency.

In other words, there is a dead band in which the control system is insensitive. FIG. 9 shows in diagram form the response of the phase error measurement circuits for the three different cases depicted above.

The phase errors 0E of the read pulses RD as to VF0 appear on the abscissa and the corresponding duration of the error pulses P UP, P DOWN* which are generated appear on the ordinate. Since the correcting function of signals P DOWN* is negative, the corresponding duration is shown on the negative axis of the ordinate. The solid line 33 shows the proportional relationship existing between positive phase errors and duration of the corresponding error signal P UP. The solid line 34 shows the proportional relationship existing between negative phase errors and duration of the corresponding signal P DOWN* when VF0 has the same frequency of F0.

The solid line 35 shows the relationship between negative phase error and duration of the corresponding error signal when the VF0 frequency is greater than the F0 frequency.

A shift or offset of line 35 as to line 34 may be noted.

This offset results at control level in an actual offset relative to the desired one. In other words, if the RD pulses are lagging, the error signal P DOWN* tends to correct the VF0 frequency and to decrease it until the RD pulses are leading by a certain amount identified by point 36 of the diagram rather than being exactly phased.

Figure 10:
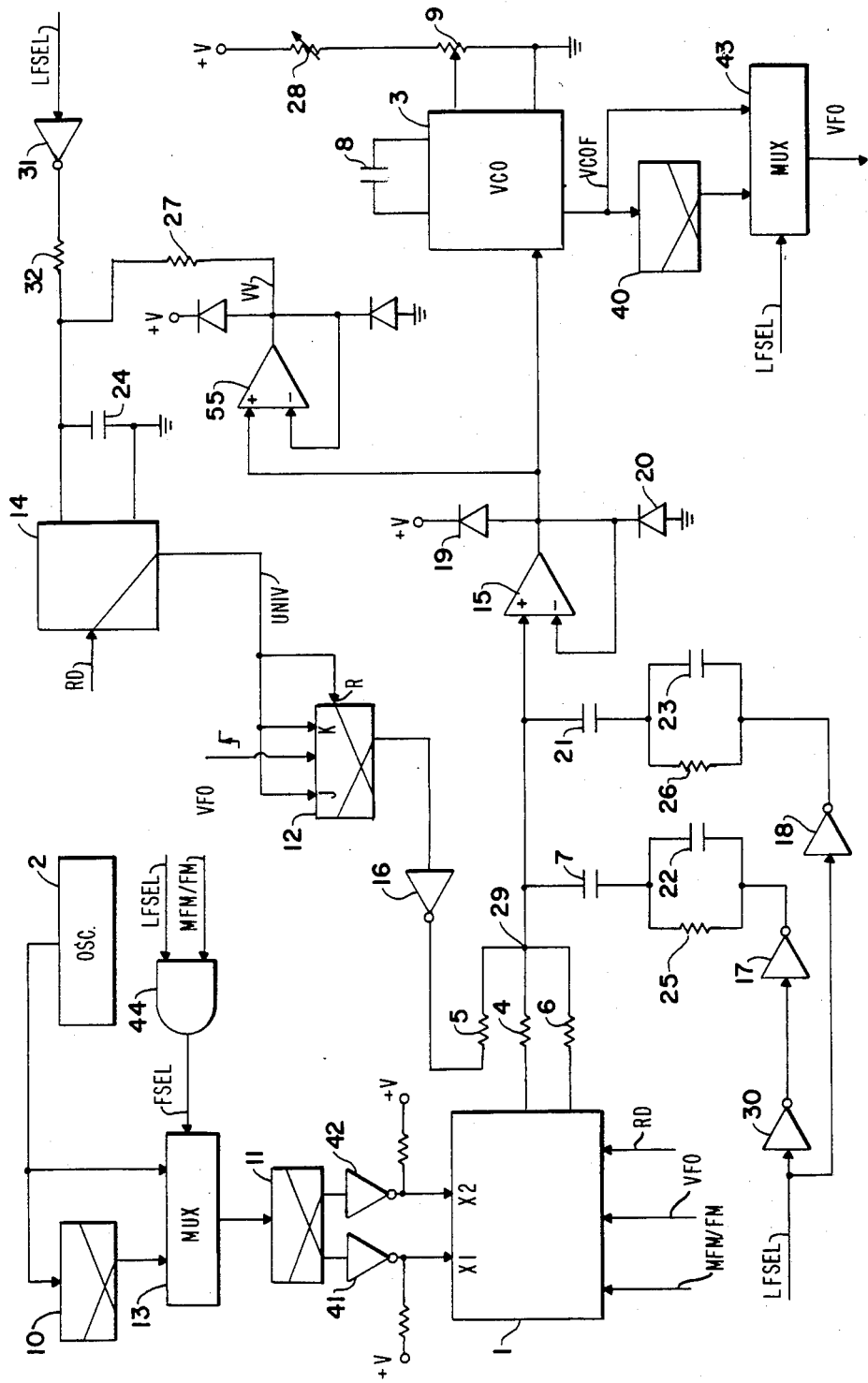
FIG. 10 shows a second preferred form of the embodiment of the phase lock circuit according to the invention.

More precisely in the error range between the origin and point 36 there is an overlapping of corrective actions so that the effective regulation diagram results to be the one shown by dotted line 37. The solid line 38 shows the relationship existing between negative phase errors and the duration of the corresponding error signal when VF0 frequency is less than the F0 frequency. Even in this case an offset may be noted which at control level results in an offset of the actual point as to the desired one: in other words if the RD pulses are lagging, the error signal P DOWN* tends to correct the VF0 frequency ad to increase it until the phase error is the one defined by point 39. At this point the corrective action ceases. Therefore the system is insensitive to negative phase errors between the origin and the value identified by point 39. This limitation may be overcome by the phase circuit shown in FIG. 10 which differs from the phase circuit of FIG. 5 in some details.

Therefore the corresponding elements which perform the same function are referenced by the same numeral. The substantive difference between the circuit of FIG. 10 and the one of FIG. 5 is that resistor 27, which defines the duration of the pulses UNIV generated by multivibrator 14, rather than being connected to voltage source +V is connected to a variable voltage VV. This voltage VV is "de facto" the same voltage inputted to oscillator VC0 3 and is obtained from an operational MOSFET amplifier 55 identical to amplifier 15 and having the same "voltage follower" function. Since the oscillator VC0 3 response is substantially linear and proportional (in other words VC0F:VV), the changes of VV are proportionally equal to the changes of VF0 and VC0F. The duration of the UNIV pulses, generated by multivibrator 14 depends on the time required by capacitor 24 to be charged to a pre-established threshold level VS.

This time is clearly a function of the time constant of the RC circuit comprised of resistors 27 and 32 and capacitor 24, but with reasonable approximation is also inversely proportional to the voltage feeding the RC network at least so long as the leading voltage is reasonably greater than the threshold voltage VS (VV>1.5 VS). By changing voltage VV it is possible to change the duration of the UNIV pulses to the same percentage as the changes to the VF0 period.

As a result the duration of the UNIV pulses may be rendered equal to half the VF0 period rather than ½ the F0 period. The condition (VV≧1.5 V5) may be easily satisfied considering that the integrated circuit 74S123 has a threshold value of about 2 V and that the integrated circuit 74LS624 accepts a frequency control voltage ranging from 0 V to 5 V. Therefore a working point may be established for VC0 3, for which an output frequency of signal VC0F of 1 MHz corresponds to a control voltage of 4 V.

As an alternative, the operational amplifier 55 may be used as a "voltage follower plus offset" and may apply a voltage equal to the voltage controlling VC0 3 plus a fixed quantity to resistor 27. In this case the working point for VC0 3 may be set at range center so that an output VC0F frequency of 1 MHz corresponds to a control voltage of 2.5 V.

It is clear that several other changes may be provided to the phase lock circuits of FIGS. 5 and 9 without departing from the scope of the invention. For instance inverter elements 16, 17, 18 and 31, by connecting the inputs to suitable level signal sources, may be substituted for equivalent components such as open collector NORs, open collector NANDs, etc. Likewise the time constant of RC network coupled to multivibrator 14 may be changed by providing as a substitute for resistor 32, a capacitor which is selectively connected and disconnected as was the resistor 32.

It is further clear that if a phase lock circuit is desired which has to operate at a single frequency, several of the components such as flip-flops 10, 11 and 40, multiplexers 13 and 43, capacitors 7 and 22, resistors 25 and 32 and gates 17, 18 30, 31 and 44 may be omitted.

Although the description refers to the handling of disks recorded at a frequency of 250 KHz and 500 KHz, it is clear that the same implementation concepts may be used for phase lock circuits working at frequencies other than the indicated ones; for instance rigid disks typically working at a 5 MHz frequency, and "streamer tapes" recently put in the market.

For description completeness, the value of some parameters, useful for obtaining the desired performances are given as follows.

Values of resistor 4, 5, 6 are equal to 5.6K, 10K, and 100K Ohms respectively.

Values of resistors 25 and 26 are equal to 1K and 1.5K Ohms respectively.

Values of capacitors 7 and 21 are equal to 22 nF, 47 nF respectively.

Value of capacitors 22 and 23 are equal to 1500 pF.

While the invention has been shown and described with reference to the preferred embodiment thereof, it will be understood by those skilled in the art that the above and other changes in form and detail may be made therein without departing from the spirit and scope of the invention.

What is claimed is:

1. Phase lock circuit comprising an oscillator for generating a working frequency twice the nominal recording frequency of data recorded on a magnetic media,
   a phase comparator having a first input for receiving periodical reading pulses of said media, a second input for receiving said working frequency, and a third input for receiving a VF0 signal having a variable frequency, said phase comparator generating a pulses positive phase error signal consisting in voltage pulses having width equal to the lag between the rising edge of each of said periodical reading pulses and a reference edge of said VF0 signal;
   circuit means for generating a pulsed negative phase error signal, consisting of voltage pulses having width substantially equal to the lag between said rising edge of each of said periodical reading pulses and said reference edge of said VF0 signal;
   an integrating filter network having a node, a first resistor having one terminal connected to said node and the other terminal connected to said phase comparator and fed by said positive phase error signal, a second resistor having one terminal connected to said node and the other terminal connected to switching means, controlled by said pulsed negative phase error signal to ground said other terminal for the duration of said negative phase pulses error signal, a first capacitor having a terminal connected to said node and the other terminal ground connected through a first compensating network comprising a compensating resistor and a compensating capacitor, parallel connected;
   a variable frequency oscillator for generating a periodical signal having variable frequency proportional to the voltage received at an input; and
   a high input impedance voltage follower having an input connected to said node and the output connected to the input of said variable frequency oscillator, the periodical signal having variable frequency generated by said variable frequency oscillator being input to said phase comparator third input and to an input of said circuit means.

2. Phase lock circuit as claimed in claim 1 wherein said oscillator comprises a frequency divider and a multiplexer controlled by at least one control signal to provide to said phase comparator, selectively, one of two working frequencies, and wherein said integrating network comprises a second capacitor having an armature connected to said node and the other armature connected to ground through a second compensating network comprising a compensating resistor and a compensating capacitor and first logic control means controlled by said control signal to disconnect from ground, in mutually exclusive way, said first or second capacitor, and wherein said variable frequency oscillator comprises a frequency divider and a multiplexer, controlled by said control signal for generating at least two variable frequency signals, one having frequency twice of the other, and for inputing to said third input of said phase comparator, selectively, one of said two variable frequency signals.

3. Phase lock circuit as claimed in claim 2 wherein said circuit means comprises a multivibrator, triggered by the rising edge of said periodical reading pulses for generating pulses having duration established by an external integrating network having at least two time constants, selectable in mutually exclusive way by said control signal and second logical means receiving in input the pulses generated by said multivibrator and a periodical signal in output from said variable frequency oscillator for generating said pulsed negative phase error signal.

4. Phase lock circuit as claimed in claim 3 wherein said external integrating network is fed by a voltage signal variable substantially as the voltage at said node.

5. Phase lock circuit as claimed in claim 4 wherein said variable frequency oscillator for generating in mutually exclusive way at least two variable frequency signals comprises an external capacitor and an external trimming resistor defining a single working range independently of the variable frequency signal selected in output from said variable frequency oscillator.

6. Phase lock circuit as claimed in claim 5 wherein said variable frequency oscillator comprises a PCT resistor for the stabilization in temperature of said working range.

* * * * *

UNITED STATES PATENT AND TRADEMARK OFFICE
CERTIFICATE OF CORRECTION

PATENT NO. : 4,814,725
DATED : March 21, 1989
INVENTOR(S) : Paolo Vitiello

It is certified that error appears in the above-identified patent and that said Letters Patent is hereby corrected as shown below:

On the title page

Please correct name of Assignee from "Honeywell Bull Inc." and insert -- Honeywell Bull Italia S.p.A.--.

Signed and Sealed this

First Day of August, 1989

Attest:

DONALD J. QUIGG

Attesting Officer

Commissioner of Patents and Trademarks